United States Patent [19]

Saito et al.

[11] Patent Number: 4,897,560
[45] Date of Patent: Jan. 30, 1990

[54] SEMICONDUCTOR INTEGRATED CIRCUIT WITH REDUCED POWER CONSUMPTION

[75] Inventors: Shinji Saito, Kasugai; Kazuyuki Nonaka, Seto; Hideji Sumi; Takehiro Akiyama, both of Kasugai, all of Japan

[73] Assignees: Fujitsu Limited, Kawasaki; Fujitsu VLSI Limited, Kasugai, both of Japan

[21] Appl. No.: 190,745

[22] Filed: May 5, 1988

[30] Foreign Application Priority Data

May 9, 1987 [JP] Japan .................. 62-112842

[51] Int. Cl.$^4$ ................ H03K 17/16; H03K 19/086
[52] U.S. Cl. ................... 307/296.3; 307/491; 307/443; 307/455
[58] Field of Search ........... 307/296 R, 297, 443, 307/455, 475, 491, 296.3, 296.4; 323/313, 315

[56] References Cited

U.S. PATENT DOCUMENTS

| | | | |
|---|---|---|---|
| 3,794,861 | 2/1974 | Bernacchi | 307/297 |
| 4,490,670 | 12/1984 | Wong | 307/297 |
| 4,533,842 | 8/1985 | Yang et al. | 307/297 |
| 4,599,521 | 7/1986 | Kanai et al. | 307/297 |
| 4,625,129 | 11/1986 | Ueno | 307/296 R |
| 4,678,935 | 7/1987 | Nawata et al. | 307/297 |

Primary Examiner—Andrew J. James
Assistant Examiner—Timothy P. Callahan
Attorney, Agent, or Firm—Armstrong, Nikaido, Marmelstein, Kubovcik & Murray

[57] ABSTRACT

A semiconductor integrated circuit includes a logic circuit which has first and second transistors constituting an emitter coupled transistor pair and a third transistor which is used as a constant current source, a bias circuit which includes a fourth transistor having an emitter from which a first predetermined voltage is supplied to a base of the third transistor and an impedance having one end coupled to a first power source and another end coupled to a base of the fourth transistor to supply a second predetermined voltage thereto, and a clamping circuit. The clamping circuit is OFF and does not perform a clamping operation with respect to the base of the fourth transistor when the entire semiconductor integrated circuit needs to operate. When the entire semiconductor integrated circuit does not need to operate, the clamping circuit is ON to clamp the base potential of the fourth transistor so as to reduce the power consumption of the semiconductor integrate circuit.

10 Claims, 7 Drawing Sheets

SEMICONDUCTOR INTEGRATED CIRCUIT WITH REDUCED POWER CONSUMPTION

BACKGROUND OF THE INVENTION

The present invention generally relates to semiconductor integrated circuits, and more particularly to a semiconductor integrated circuit with reduced power consumption.

FIG. 1 shows an example of the conventional synthesizer tuner. The synthesizer tuner comprises a high frequency amplifier 11, a frequency mixer 12, an intermediate frequency amplifier 13, a frequency demodulator 14, a stereo demodulator 15, low frequency demodulators 16 and 17, and an oscillator circuit 20. The oscillator circuit 20 comprises a local oscillator 21, a prescaler 22, a programmable counter 23, a crystal oscillator 24, a frequency divider 25, a phase comparator 26, a low pass filter 27, and a voltage control circuit 28.

A very high frequency (VHF) signal received by an antenna 10 is amplified in the high frequency amplifier 11 and supplied to the frequency mixer 12. A voltage from the oscillator circuit 20 is supplied to the frequency mixer 12, and the frequency mixer 12 outputs an intermediate frequency signal corresponding to a difference between the frequency of the received signal and the oscillation frequency of the oscillator circuit 20. The intermediate frequency signal is amplified in the intermediate frequency amplifier 13 and supplied to the frequency demodulator 14 which frequency-demodulates the intermediate frequency signal. A demodulated output signal of the frequency demodulator 14 is supplied to the stereo demodulator 15 which separates the demodulated output signal into right-channel and left-channel signals. The right-channel signal is amplified in the low frequency amplifier 16 and outputted through an output terminal 18, while the left-channel signal is amplified in the low frequency amplifier 17 and outputted through an output terminal 19.

The voltage control circuit 28 of the oscillator circuit 20 is provided to reduce the power consumption of the prescaler circuit 22. An output signal of the local oscillator 21 is frequency-divided in the prescaler circuit 22, and the prescaler circuit 22 supplies a frequency divided signal to the programmable counter 23. A predetermined counted value N is set in the programmable counter 23. An output signal of the programmable counter 23 is supplied to the phase comparator 26. On the other hand, an output signal of the crystal oscillator 24 is frequency-divided in the frequency divider 25 and supplied to the phase comparator 26. The phase comparator 26 compares the phase of the output signal of the programmable counter 23 and the phase of the output signal of the frequency divider 25, and outputs a phase error signal dependent on the phase error between the two signals. The phase comparator 26 uses the output phase error signal thereof to control the oscillation frequency of the local oscillator 21 through the lowpass filter 27.

When the phases of the two signals compared in the phase comparator 26 coincide, the synthesizer tuner operates only responsive to the output signal of the local oscillator 21, and the prescaler 22 is substantially unused. In the case, the phase comparator 26 supplies to the voltage control circuit 28 a signal which indicates that the phases of the two compared signals coincide, and the voltage control circuit 28 cuts off the supply of the voltage to the prescaler 22. The operation speeds of the programmable counter 23 and the phase comparator 26 are slow compared to the operation speed of the prescaler 22. For this reason, it takes a few milliseconds for the phase error to occur after the supply of voltage to the prescaler 22 is cut off.

When the phase error occurs, the voltage control circuit 28 is operated responsive to the output signal of the phase comparator 26. As a result, the voltage is supplied to the prescaler 22 from the voltage control circuit 28, and the phase comparison is normally carried out in the phase comparator 26. Generally, an OFF time period in which the supply of voltage to the prescaler 22 is cut off is set to a value in the order of 1/5 an ON time period in which the supply of voltage to the prescaler 22 is made, so that the tuning error is negligible to the listener.

However, according to the conventional oscillator circuit 20 in which the voltage control circuit 28 supplies a reduced small voltage to the prescaler 22 so as to reduce the power consumption, it requires a large voltage to return the prescaler 22 and a large driving capacity is required of the voltage control circuit 28 in order to increase the voltage supplied to the prescaler 22. For this reason, the circuit scale of the voltage control circuit 28 inevitably becomes large. In addition, the circuit construction of the voltage control circuit 28 becomes complex because the voltage setting after the prescaler 22 is returned must be made with a high accuracy.

SUMMARY OF THE INVENTION

Accordingly, it is a general object of the present invention to provide a novel and useful semiconductor integrated circuit in which the problems described heretofore are eliminated.

Another and more specific object of the present invention is to provide a semiconductor integrated circuit comprising a first power source for supplying a first power source voltage, a second power source for supplying a second power source voltage lower than the first power source voltage, a logic circuit coupled between the first and second power sources and comprising at least first and second transistors constituting an emitter coupled transistor pair, a third transistor used as a constant current source for supplying a current to the first and second transistors, an input terminal operatively coupled to a base of the first transistor for receiving an input signal to the semiconductor integrated circuit and an output terminal operatively coupled to a collector of the first transistor for outputting an output signal of the semiconductor integrated circuit, a bias circuit coupled between the first and second power sources and comprising a fourth transistor having an emitter from which a first predetermined voltage is supplied to a base of the third transistor and impedance means coupled between the first and second power sources, where the impedance means has one end coupled to the first power source and another end coupled to a base of the fourth transistor to supply a second predetermined voltage thereto, and a clamping circuit coupled between the base of the fourth transistor and the second power source and turned ON and OFF responsive to a control signal applied thereto. The clamping circuit is an ON state turns OFF the fourth and third transistors. On the other hand, the clamping circuit in an OFF state applies the second predetermined voltage to the base of the fourth transistor to turn ON the fourth transistor and applies the first predetermined voltage to the base of the third transistor to turn ON the third transistor.

According to the semiconductor integrated circuit of the present invention, the clamping circuit is OFF and does not perform the clamping operation with respect to the base of the fourth transistor when the entire semiconductor integrated circuit needs to operate. Hence, the bias circuit operates to set the base potential of the third transistor to the first predetermined voltage, thereby setting the logic circuit in the operating state capable of carrying out a predetermined logic operation. On the other hand, when the entire semiconductor integrated circuit does not need to operate, the clamping circuit is ON to clamp the base potential of the fourth transistor. In this case, the bias circuit does not operate, and the logic circuit is in a non-operating state. Therefore, it is possible to reduce the power consumption of the semiconductor integrated circuit by controlling the operating and non-operating states of the bias circuit by the clamping circuit so as to control the operating and non-operating states of the logic circuit.

Other objects and further features of the present invention will be apparent from the following detailed description when read in conjunction with the accompanying drawings.

DETAILED DESCRIPTION

Figure 1:
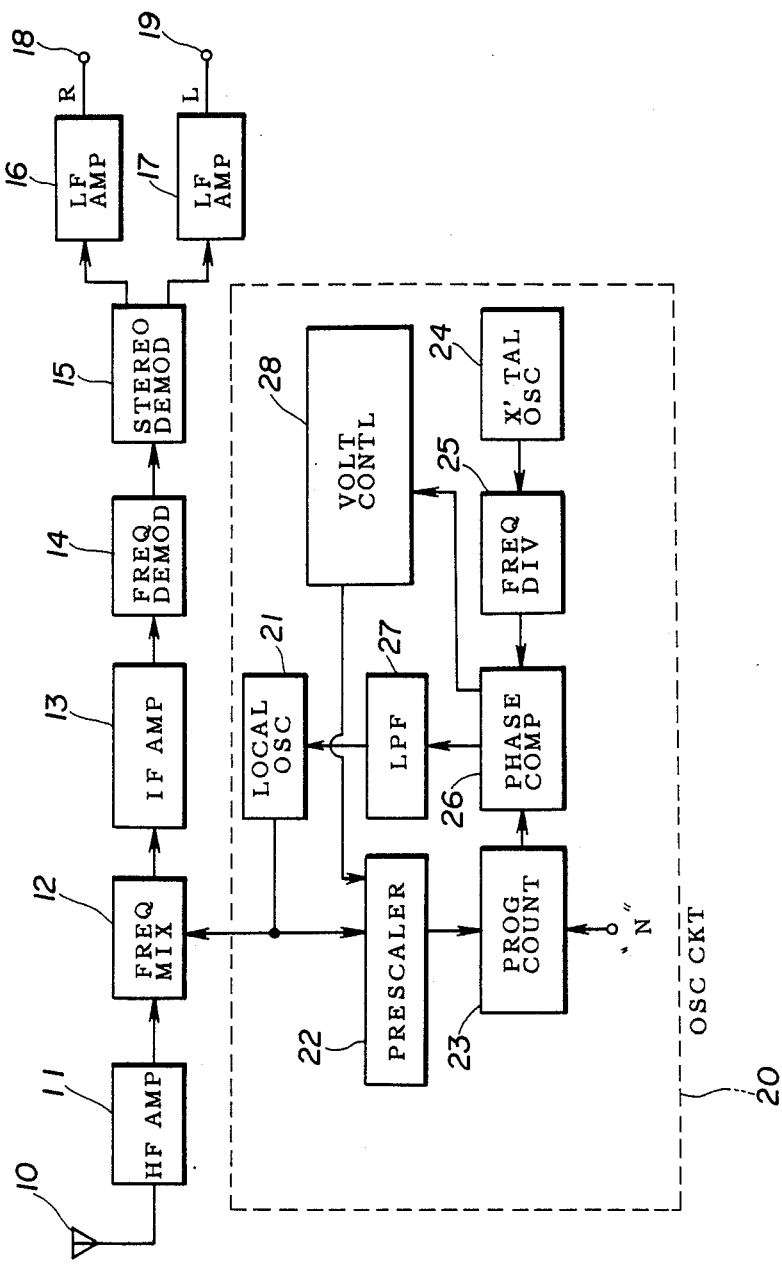
FIG. 1 is a system block diagram showing an example of the conventional synthesizer tuner.
Figure 2:
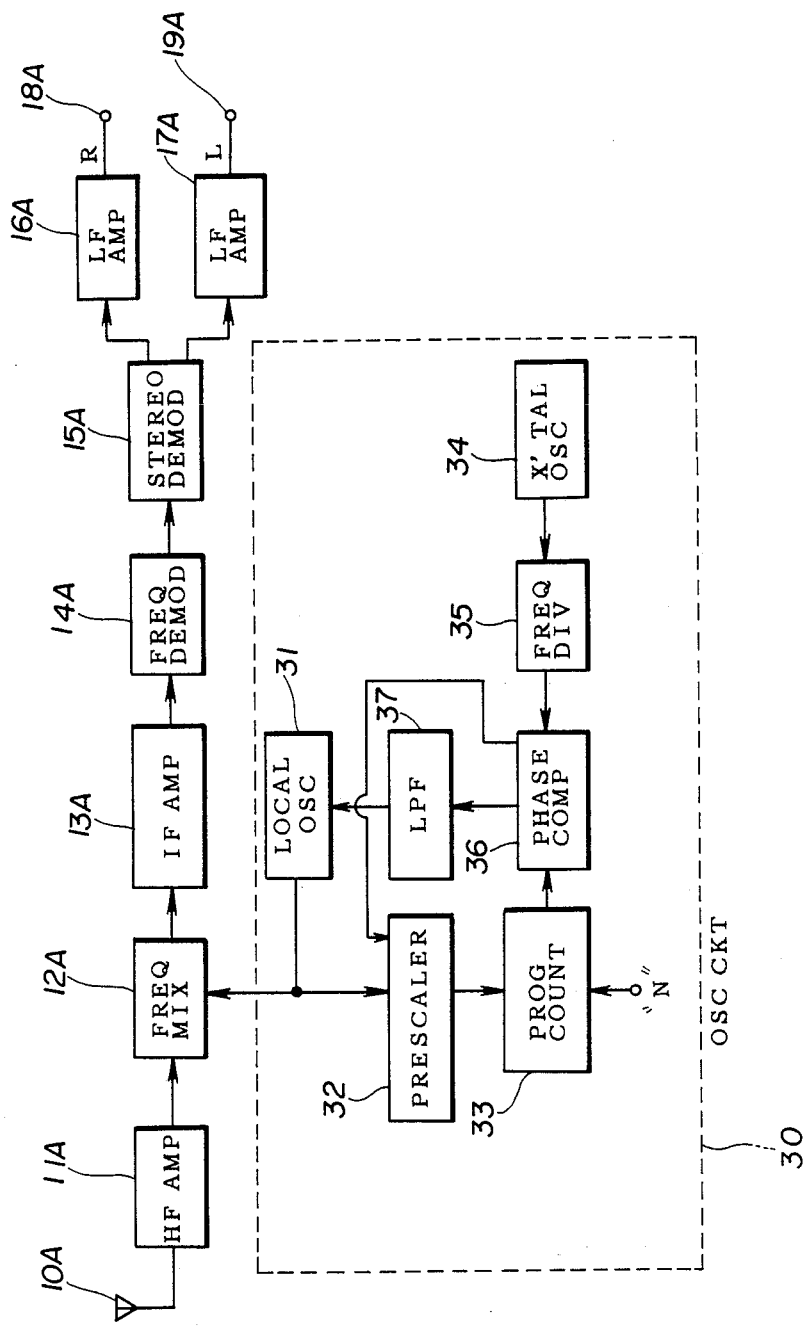
FIG. 2 is a system block diagram generally showing an embodiment of the semiconductor integrated circuit according to the present invention applied to the synthesizer tuner.

FIG. 2 generally shows an embodiment of the semiconductor integrated circuit according to the present invention applied to the synthesizer tuner. In FIG. 2, those parts which are basically the same as those corresponding parts in FIG. 1 are designated by the same reference numerals with a subscript "A", and a description thereof will be omitted. In FIG. 2, an oscillator circuit 30 comprises a local oscillator 31, a prescaler 32, a programmable counter 33, a crystal oscillator 34, a frequency divider 35, a phase comparator 36, and a lowpass filter 37.

Figure 3:
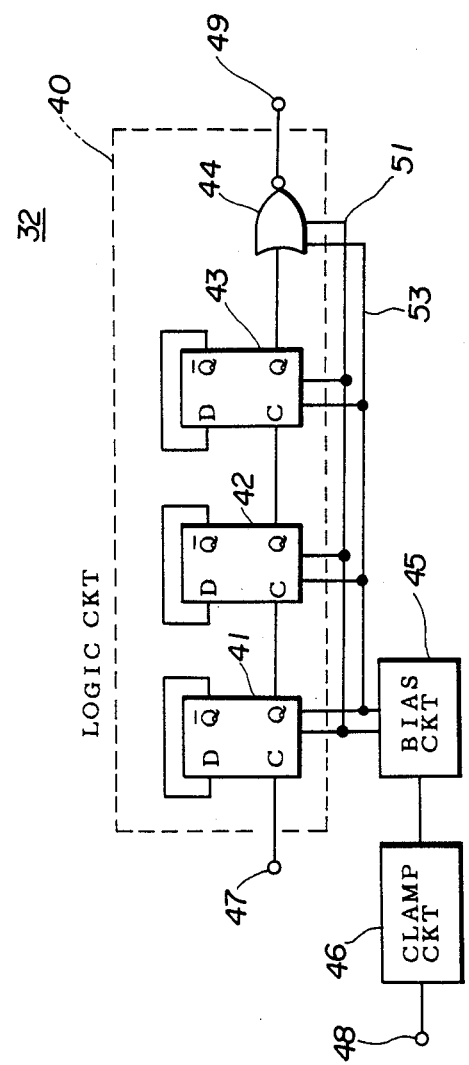
FIG. 3 is a system block diagram generally showing the construction of a prescaler of the synthesizer tuner.

FIG. 3 generally shows the construction of the prescaler 32 of the synthesizer tuner. The prescaler 32 comprises a logic circuit 40 constituted by flip-flop circuits 41 through 43 and an output buffer 44, a bias circuit 45, and a clamping circuit 46 which are connected as shown. An output signal of the local oscillator 31 is applied to an input terminal 47, and an output signal of the phase comparator 36 is applied to an input terminal 48. An output signal of the output buffer 44 is outputted through an output terminal 49 as an output signal of the prescaler 32.

Figure 4:
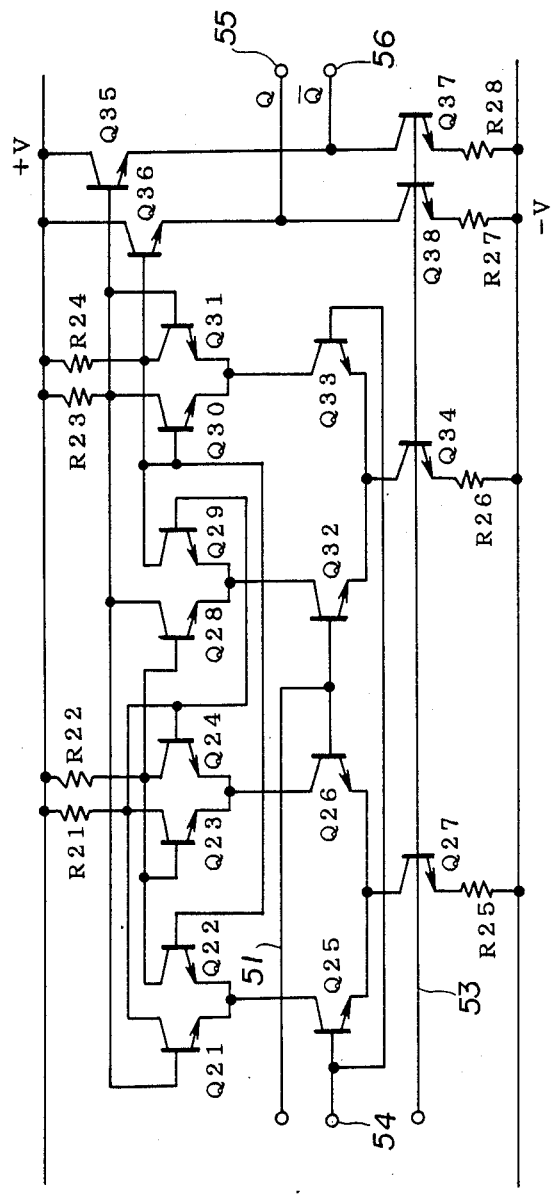
FIG. 4 is a circuit diagram showing an embodiment of a flip-flop circuit of the prescaler shown in FIG. 3.

FIG. 4 shows an embodiment of the flip-flop circuit 41. The flip-flop circuit 41 comprises transistors Q21 through Q38 and resistors R21 through R28 which are connected as shown and is an emitter coupled logic (ECL) circuit. A current control line 53 and a reference line 51 run as shown. An input terminal 54 corresponds to a clock terminal C of the flip-flop circuit 41, and output terminals 55 and 56 respectively correspond to Q-output and $\overline{Q}$-output terminals of the flip-flop circuit 41. $+V$ denotes a positive power source voltage and $-V$ denotes a negative power source voltage (ground voltage) from respective power sources ($+V$ and $-V$). The construction of the flip-flop circuits 42 and 43 are identical to that of the flip-flop circuit 41, and a description thereof will be omitted.

Figure 5:
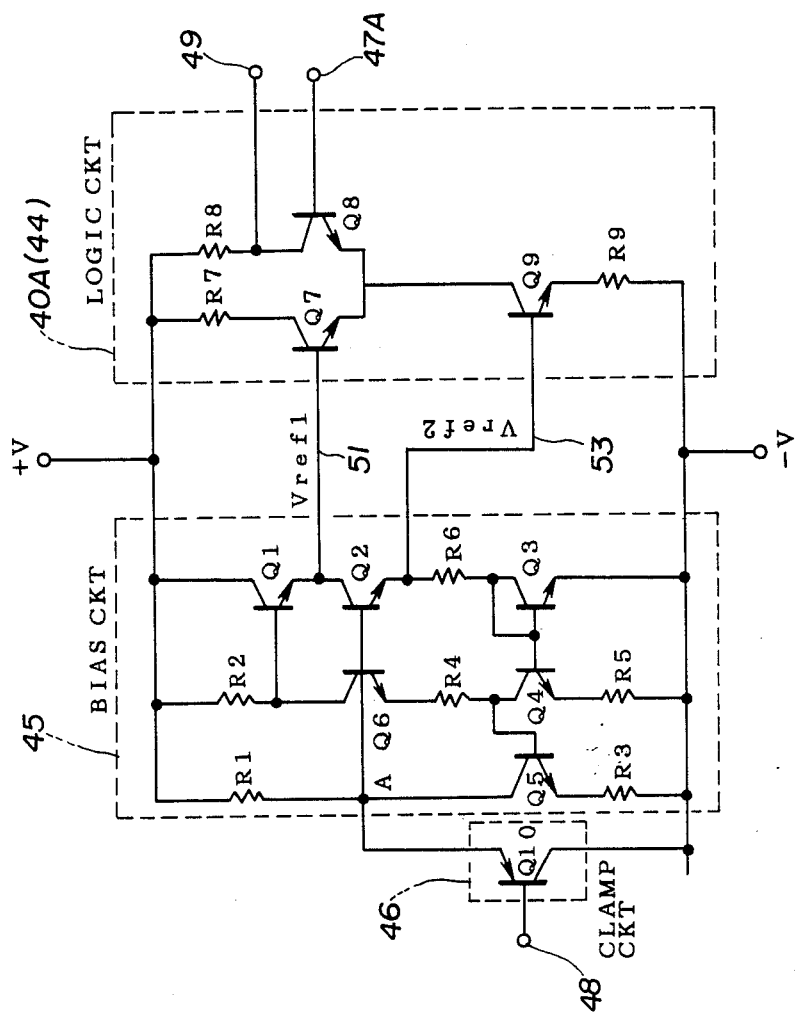
FIG. 5 is a circuit diagram showing an essential part of a first embodiment of the semiconductor integrated circuit according to the present invention applicable to the prescaler.

FIG. 5 shows an essential part of a first embodiment of the semiconductor integrated circuit according to the present invention applicable to the prescaler 32. In FIG. 5, those parts which are the same as those corresponding parts in FIG. 3 are designated by the same reference numerals, and a description thereof will be omitted. The bias circuit 45 comprises transistors Q1 through Q6 and resistors R1 through R6 which are connected as shown. A logic circuit 40A comprises transistors Q7 through Q9 and resistors R7 through R9 which are connected as shown, and corresponds to the output buffer 44 shown in FIG. 3 for essentially carrying out a logic operation of the prescaler 32. The clamping circuit 46 comprises a pnp transistor Q10. $+V$ and $-V$ denote positive and negative power source voltages, respectively.

The transistors Q7 and Q8 of the logic circuit 40A constitute an emitter coupled transistor pair (differential pair), and the transistor Q9 is used as a constant current source. A node between the transistors Q1 and Q2 of the bias circuit 45 and a base of the transistor Q7 of the logic circuit 40A are connected by the current control line 51 The current control line 51 is used to apply to the base of the transistor Q7 a reference voltage for the differential pair. The transistor Q10 connects to a node A which is connected to a base of the transistor Q2 of the bias circuit 45, and clamps a potential of the base of the transistor Q2 to a predetermined voltage level.

In FIG. 2, when the prescaler 32 receives the output signal of the local oscillator 31, the prescaler 32 supplies a frequency divided signal to the programmable counter 33. A predetermined counted value N is set in the programmable counter 33. The phase comparator 36 compares the phase of the output signal of the programmable counter 33 and the phase of an output signal of the frequency divider 35 which frequency-divides an output signal of the crystal oscillator 34. The phase comparator 36 outputs a phase error signal dependent on a phase error between the two compared signals, and feeds back this phase error signal to the local oscillator 31 through the lowpass filter 37.

When the phases of the two compared signals coincide in the phase comparator 36, the phase comparator 36 supplies a low-level signal to the input terminal 48 for clamping circuit 46 of the prescaler 32. As a result of the ON state of the transistor Q10, the base potential of the transistor Q2 of the bias circuit 45 is clamped to a low voltage (the low-level input signal $+V_{BE}(Q10)$), thereby turning the transistors Q2 and Q6 OFF. Accordingly, a current flowing through the bias circuit 45 only corresponds to a current flowing to the transistor Q10 through the resistor R1, and is extremely small. In addition, the transistor Q9 used as the constant current source is turned OFF to stop the operation of the logic circuit 40A when the transistor Q2 is turned OFF. As a result, there is virtually no current flowing to the output buffer 44.

In other words, in a normal state, a bias potential Vref2 (base potential of the transistor Q9) for controlling the current flowing to the transistor Q9 is determined by a current flowing at the node A. The bias potential Vref2 is a base-emitter voltage of the transistor Q2 smaller than the potential at the node A and can be described by the following formula, where $I_1$ denotes a current flowing through the resistor R1, R1 denotes the resistance of the resistor R1, and $V_{BE}(Q2)$ denotes the base-emitter voltage of the transistor Q2.

$$Vref2 = +V - I_1R1 - V_{BE}(Q2)$$

On the other hand, a reference potential Vref1 at the reference line 51 in the normal state can be described by the following formula, where $I_2$ denotes a current flowing through the resistor R2, R2 denotes the resistance of the resistor R2, and $V_{BE}(Q1)$ denotes a base-emitter voltage of the transistor Q1.

$$Vref1 = +V - I_2R2 - V_{BE}(Q1)$$

That is, the reference potential Vref1 in the normal state is an intermediate potential between high and low levels of the input signal applied to a base of the transistor Q8 through an input terminal 47A. The input signal applied to the input terminal 47A corresponds to the Q-output of the flip-flop circuit 43 in FIG. 3.

But in a clamping state where the low-level output signal ($-V$) is outputted from the phase comparator 36, the transistor Q10 is turned ON and the potential at the node A is clamped to the low voltage corresponding to the base-emitter voltage $V_{BE}(Q10)$ of the transistor Q10 above the low-level output signal ($-V$). Thus, the transistors Q2 and Q6 are turned OFF, and the base potential of the transistor Q9, that is, the bias potential Vref2 decreases. Since the transistor Q9 functions as the constant current source of the logic circuit 40A, a current no longer flows to the logic circuit 40A when the transistor Q9 turns OFF.

Therefore, according to the present embodiment, the transistor Q9 is turned OFF to reduce the power consumption in the logic circuit 40A, and in addition, the transistor Q10 (clamping circuit 46) is provided to clamp the potential at the node A so as to reduce the current in the bias circuit 45. As a result, it is possible to reduce the power consumption of the bias circuit 45 itself. Hence, the prescaler 32 is made inactive for a predetermined time after the phases of the two compared signals coincide in the phase comparator 36, and the power consumption of the prescaler 32 is extremely small.

On the other hand, when there is a phase error between the two compared signals, the phase comparator 36 supplies a high-level signal to the prescaler 32. In this case, the potential at the node A returns to a predetermined voltage, thereby turning the transistor Q2 ON. a constant voltage is thus applied to the base of the transistor Q9, and the output buffer 44 returns to a state capable of carrying out the logic operation of the prescaler 32.

Accordingly, the prescaler 32 can easily be returned to the operating state by use of the clamping circuit 46 having a simple circuit construction. No complex and large scale voltage control circuit is required contrary to the conventional synthesizer tuner.

In FIG. 5, the output buffer 44 of the prescaler 32 shown in FIG. 3 is described as an example of the logic circuit 40A. However, as shown in FIG. 3, the logic circuit 40A shown in FIG. 5 connected with the flip-flop circuits 41, 42 and 43 is also an embodiment of the semiconductor integrated circuit according to the present invention. In other words, when the current control line 53 from the bias circuit 45 assumes the clamping level, the currents to the flip-flop circuits 41, 42 and 43 are all cut off.

Figure 6:
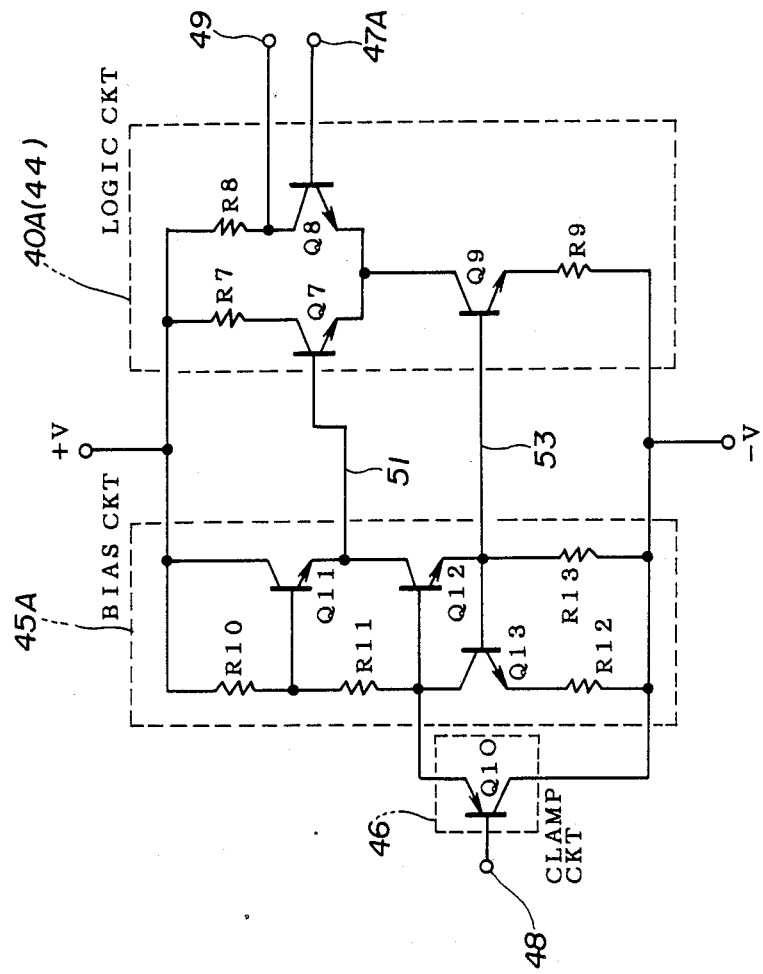
FIG. 6 is a circuit diagram showing an essential part of a second embodiment of the semiconductor integrated circuit according to the present invention applicable to the prescaler.

FIG. 6 shows an essential part of a second embodiment of the semiconductor integrated circuit according to the present invention applicable to the prescaler 32. In FIG. 6, those parts which are the same as those corresponding parts in FIG. 5 are designated by the same reference numerals, and a description thereof will be omitted. A bias circuit 45A comprises transistors Q11 through Q13 and resistors R10 through R13 which are connected as shown.

The bias circuit 45 of the first embodiment shown in FIG. 5 has a function of compensating for a deviation in the power source voltage and a function of compensating for a change in characteristics of elements caused by a temperature change. On the other hand, the bias circuit 45A of the second embodiment shown in FIG. 6 only has the function of compensating for the deviation in the power source voltage. However, a base potential of the transistor Q12 of the bias circuit 45A can be clamped by the clamping circuit 46, and it is possible to reduce the power consumption of the prescaler 32 similarly as in the case of the first embodiment.

Figure 7:
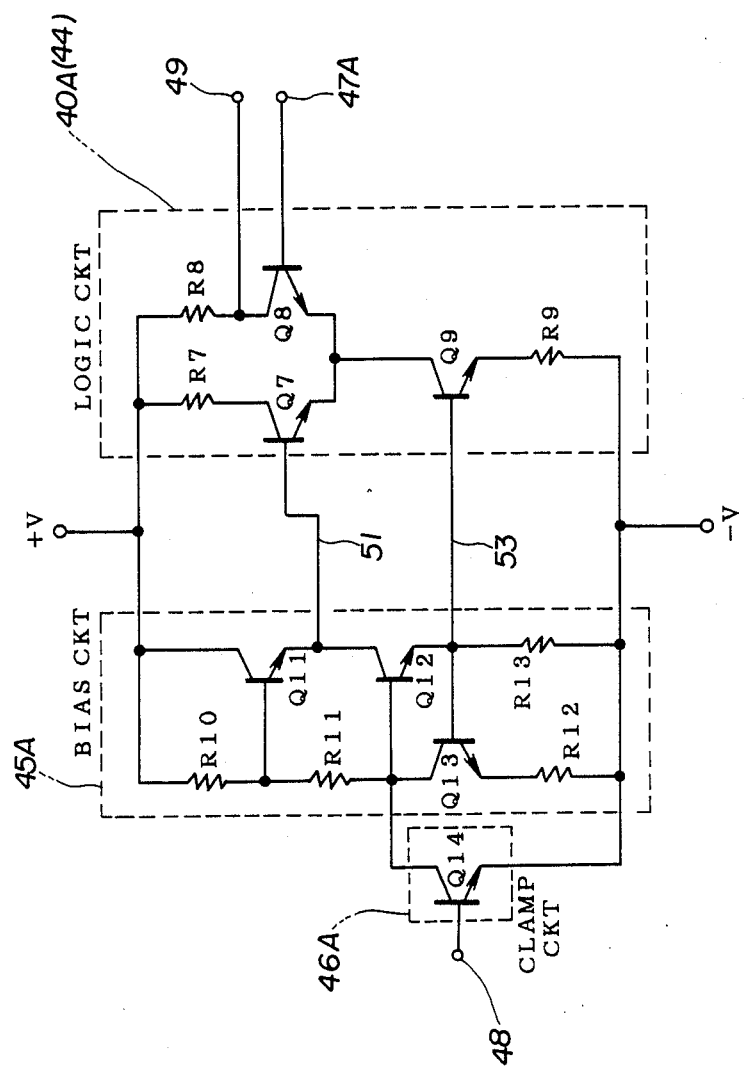
FIG. 7 is a circuit diagram showing an essential part of a third embodiment of the semiconductor integrated circuit according to the present invention applicable to the prescaler.

FIG. 7 shows an essential part of a third embodiment of the semiconductor integrated circuit according to the present invention applicable to the prescaler 32. In FIG. 7, those parts which are the same as those corresponding parts in FIG. 6 are designated by the same reference numerals, and a description thereof will be omitted. A clamping circuit 46A comprises an npn transistor Q14 which is connected to the bias circuit 45A as shown. In the present embodiment, the phase comparator 36 supplies a high-level signal to the prescaler 32 when the phases of the two compared signals in the phase comparator 36 coincide, and the clamping circuit 46A operates to reduce the power consumption of the prescaler 32. On the other hand, when there is a phase error between the two compared signals in the phase comparator 36, the phase comparator 36 supplies a low-level signal to the prescaler 32, and the output buffer 44 of the prescaler 32 carries out the logic operation of the prescaler 32.

In the embodiment described heretofore, the present invention is applied to a prescaler for reducing the power consumption thereof. However, the present invention is of course applicable to constant current type logic circuits other than the prescaler and provided with a bias circuit.

Further, the present invention is not limited to these embodiments, but various variations and modifications may be made without departing from the scope of the present invention.

What is claimed is:

1. A semiconductor integrated circuit, comprising:
a first power source for supplying a first power source voltage;
a second power source for supplying a second power source voltage lower than the first power source voltage;
a logic circuit coupled between said first and second power sources, said logic circuit including at least first and second transistors constituting an emitter coupled transistor pair and having collectors coupled to said first power source, a third transistor used as a constant current source for supplying a current to said first and second transistors, an input terminal operatively coupled to a base of said first transistor for receiving an input signal to said semiconductor integrated circuit and an output terminal operatively coupled to a collector of said first transistor for outputting an output signal of said semiconductor integrated circuit;
a bias circuit coupled between said first and second power sources, said bias circuit including a fourth transistor having an emitter from which a first predetermined voltage is supplied to a base of said third transistor and impedance means having one end coupled to said first power source and another end coupled to a base of said fourth transistor to supply a second predetermined voltage thereto; and
a clamping circuit coupled between the base of said fourth transistor and said second power source and turned ON and OFF responsive to a control signal applied thereto,
said clamping circuit in an ON state turning OFF said fourth and third transistors,
said clamping circuit in an OFF state applying said second predetermined voltage to the base of said fourth transistor to turn ON said fourth transistor and applying said first predetermined voltage to the base of said third transistor to turn ON said third transistor.

2. A semiconductor integrated circuit as claimed in claim 1, wherein said bias circuit further comprises a fifth transistor having a collector coupled to said first power source and an emitter coupled to a base of said second transistor and a collector of said fourth transistor and a base coupled to said first power source through a first resistor, said fifth transistor applying a reference voltage to the base of said second transistor which constitutes the emitter coupled transistor pair with said first transistor.

3. A semiconductor integrated circuit as claimed in claim 2, wherein said bias circuit further comprises a sixth transistor having a collector coupled to the base of said fifth transistor and a base coupled to said clamping circuit and the base of said fourth transistor, and seventh, eighth and ninth transistors having emitters coupled to said second power source, said seventh transistor having a collector coupled to said clamping circuit, said eighth transistor having a collector coupled to a base of said seventh transistor and an emitter of said sixth transistor, said ninth transistor having a base end collector coupled in common to a base of said eighth transistor and the emitter of said fourth transistor.

4. A semiconductor integrated circuit as claimed in claim 3, wherein said clamping circuit comprises a pnp transistor having an emitter coupled to the collector of said seventh transistor, a collector coupled to said second power source, and a base applied with the control signal for controlling the ON and OFF states thereof.

5. A semiconductor integrated circuit as claimed in claim 3, wherein said impedance means comprises a second resistor having one end coupled to said first power source and another end coupled to the base of said fourth and sixth transistors.

6. A semiconductor integrated circuit as claimed in claim 1, wherein said bias circuit further comprises a fifth transistor having a collector coupled to said first power source, a base coupled to said first power source through said impedance means, and an emitter coupled to the collector of said fourth transistor and a base of said second transistor.

7. A semiconductor integrated circuit as claimed in claim 6, wherein said clamping circuit comprises a pnp transistor having an emitter coupled to the base of said fourth transistor, a collector coupled to said second power source, and a base applied with the control signal for controlling the ON and OFF states thereof.

8. A semiconductor integrated circuit as claimed in claim 6, wherein said impedance means comprises a resistor having one end coupled to said first power source through the base of said fifth transistor and another end coupled to the base of said fourth transistor.

9. A semiconductor integrated circuit as claimed in claim 6, wherein said clamping circuit comprises an npn transistor having a collector coupled to the base of said fourth transistor, an emitter coupled to said second power source, and a base applied with the control signal for controlling the ON and OFF states thereof.

10. A semiconductor integrated circuit, comprising:
a first power source for supplying a first power source voltage;
a second power source for supplying a second power source voltage lower than the first power source voltage;
a logic circuit coupled between said first and second power sources, said logic circuit including at least first and second transistors constituting an emitter coupled transistor pair and having collectors coupled to said first power source, a third transistor used as a constant current source for supplying a current to said first and second transistors, an input terminal operatively coupled to a base of said first transistor for receiving an input signal to said semiconductor integrated circuit and an output terminal operatively coupled to a collector of said first transistor for outputting an output signal of said semiconductor integrated circuit;
a bias circuit coupled between said first and second power sources, said bias circuit including a fourth transistor having an emitter from which a first predetermined voltage is supplied to a base of said third transistor and impedance means having one end coupled to said first power source and another end coupled to a base of said fourth transistor to supply a second predetermined voltage thereto; and
a clamping circuit coupled between the base of said fourth transistor and said second power source and turned ON and OFF responsive to a control signal applied thereto,
said clamping circuit in an ON state turning OFF said fourth and third transistors,
said clamping circuit in an OFF state applying said second predetermined voltage to the base of said fourth transistor to turn ON said fourth transistor and applying said first predetermined voltage to the base of said third transistor to turn ON said third transistor, said bias circuit further comprises a fifth transistor having a collector coupled to said first power source and an emitter coupled to a base of said second transistor and a collector of said fourth transistor and a base coupled to said first power source through a first resistor, said fifth transistor applying a reference voltage to the base of said second transistor which constitutes the emitter coupled transistor pair with said first transistor, and said bias circuit further comprises a sixth transistor having a collector coupled to the base of said fifth transistor and a base coupled to said clamping circuit and the base of said fourth transistor, and seventh, eighth and ninth transistors having emitters coupled to said second power source, said seventh transistor having a collector coupled to said clamping circuit, said eighth transistor having a collector coupled to a base of said seventh transistor and an emitter of said sixth transistor, said ninth transistor having a base end collector coupled in common to a base of said eighth transistor and the emitter of said fourth transistor.

* * * * *